(12) United States Patent
Yamamoto

(10) Patent No.: US 6,191,996 B1
(45) Date of Patent: Feb. 20, 2001

(54) SEMICONDUCTOR MEMORY DEVICE AND DATA TRANSMISSION METHOD

(75) Inventor: Kouki Yamamoto, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/409,911

(22) Filed: Oct. 1, 1999

(30) Foreign Application Priority Data

Oct. 1, 1998 (JP) .................................................. 10-279638

(51) Int. Cl.[7] .................................................. G11C 8/00
(52) U.S. Cl. ...................................... 365/230.03; 365/63
(58) Field of Search .............................. 365/230.03, 63, 365/49, 203

(56) References Cited

U.S. PATENT DOCUMENTS 5,699,314 * 12/1997 Hush et al. ...................... 365/230.03
5,726,947 * 3/1998 Yamazaki et al. ............... 365/230.03
5,829,027 * 10/1998 Goodrum ......................... 365/230.03
5,844,856 * 12/1998 Taylor .............................. 365/230.03

* cited by examiner

*Primary Examiner*—Son T. Dinh
(74) *Attorney, Agent, or Firm*—Young & Thompson

(57) ABSTRACT

The present invention provides a semiconductor memory device having a dynamic random access memory and a static random access memory for transmissions of data between the dynamic random access memory and the static random access memory, wherein there are provided a plurality of dynamic random access memory arrays, each of which comprises a pair of a dynamic random access memory cell array and a sense amplifier for data read/write operation to the dynamic random access memory cell array, and there is provided at least a static random access memory array, and the plurality of dynamic random access memory arrays and the at least a static random access memory array are connected through at least a data transmission bus.

10 Claims, 17 Drawing Sheets

SEMICONDUCTOR MEMORY DEVICE AND DATA TRANSMISSION METHOD

BACKGROUND OF THE INVENTION

The present invention relates to a semiconductor memory device and a data transmission method thereof, and more particularly to a semiconductor memory device capable of a high speed transmission of data in a row unit or in (1/n)-row unit data and a data transmission method thereof.

Recently, the requirements for improvement in high speed operation of a large capacity main memory and for a response to increasing high frequency have been on the increase. Notwithstanding, it seems difficult to further more improve the high speed performance of the conventional dynamic random access memory used as a main memory. It was proposed to mount a high speed memory in the main memory, so that the high speed memory performs high speed data transmissions to external device whilst the dynamic random access memory serves to provide a large memory capacity. Namely, the main memory has a multi-level structure responsible for not only the large memory capacity but also the high speed performance.

Operational cycle of the dynamic random access memory is slower than operational cycle of the high speed memory in the dynamic random access memory. It is necessary to increase the number of bits for data transmissions between the high speed memory and the dynamic random access memory, so that a large amount of data transmission between the high speed memory and the dynamic random access memory can be realized and also a gap or a difference in operational speed between the high speed memory and the dynamic random access memory can be compensated, Further, the high speed memory is much smaller in memory capacity than the dynamic random access memory, for which reason effective use of the high speed memory needs to allow data transmissions between the high speed memory and the dynamic random access memory.

In order to achieve the above requirement, it is necessary to inter-connect a large number of sense amplifiers of the dynamic random access memory to a large number of the high speed memories, for which reason a total length of the inter-connections between the sense amplifiers and the high speed memories is so long. The increase in the length of the inter-connections causes an increase in parasitic capacitance of the interconnections. This increase in parasitic capacitance of the interconnections requires increasing driving ability to the high speed memories for data transmissions from the high speed memories to memory cells of the dynamic random access memory through bit lines. The increase in parasitic capacitance of the interconnections makes it necessary to take a longer data transmission time.

Thus, data having been transmitted from the high speed memories are amplified by sense amplifiers of the dynamic random access memory so that amplified data are written into memory cells of the dynamic random access memory. For this purpose, it is necessary that bit lines of the dynamic random access memory are subjected to balance/pre-charge prior to the data transmission, or necessary to inhibit previous amplification to the bit lines by the sense amplifiers.

In the above circumstances, it had been required to develop a novel semiconductor memory device and a data transmission method free from the above problem.

SUMMARY OF THE INVENTION

Accordingly, it is an object of the present invention to provide a novel semiconductor memory device free from the above problems.

It is a further object of the present invention to provide a novel semiconductor memory device capable of high speed transmission of many data in row unit.

It is a still further object of the present invention to provide a novel semiconductor memory device having a data transmission bus with an increased parasitic capacitance for allowing charges to be charged to the data transmission bus in order to realize a high speed data transmission.

It is yet a further object of the present invention to provide a novel semiconductor memory device capable of carrying out data reading operation and data transmission operation concurrently.

It is further more object of the present invention to provide a novel semiconductor memory device capable of exhibiting an improved data transmission speed and having an increased degree of freedom of transmission timing.

It is moreover object of the present invention to provide a novel data transmission method of a semiconductor memory device free from the above problems.

It is another object of the present invention to provide a novel data transmission method of a semiconductor memory device for high speed transmission of many data in row unit.

It is still another object of the present invention to provide a novel data transmission method of a semiconductor memory device having a data transmission bus with an increased parasitic capacitance for allowing charges to be charged to the data transmission bus in order to realize a high speed data transmission.

It is yet another object of the present invention to provide a novel data transmission method of a semiconductor memory device capable of carrying out data reading operation and data transmission operation concurrently.

It is further another object of the present invention to provide a novel data transmission method of a semiconductor memory device capable of exhibiting an improved data transmission speed and having an increased degree of freedom of transmission timing.

The present invention provides a semiconductor memory device having a dynamic random access memory and a static random access memory for transmissions of data between the dynamic random access memory and the static random access memory, wherein there are provided a plurality of dynamic random access memory arrays, each of which comprises a pair of a dynamic random access memory cell array and a sense amplifier for data read/write operation to the dynamic random access memory cell array, and there is provided at least a static random access memory array, and the plurality of dynamic random access memory arrays and the at least a static random access memory array are connected through at least a data transmission bus.

The above and other objects, features and advantages of the present invention will be apparent from the following descriptions,

BRIEF DESCRIPTION OF THE DRAWINGS

Preferred embodiments according to the present invention will be described in detail with reference to the accompanying drawings.

DISCLOSURE OF THE INVENTION

Figure 1:
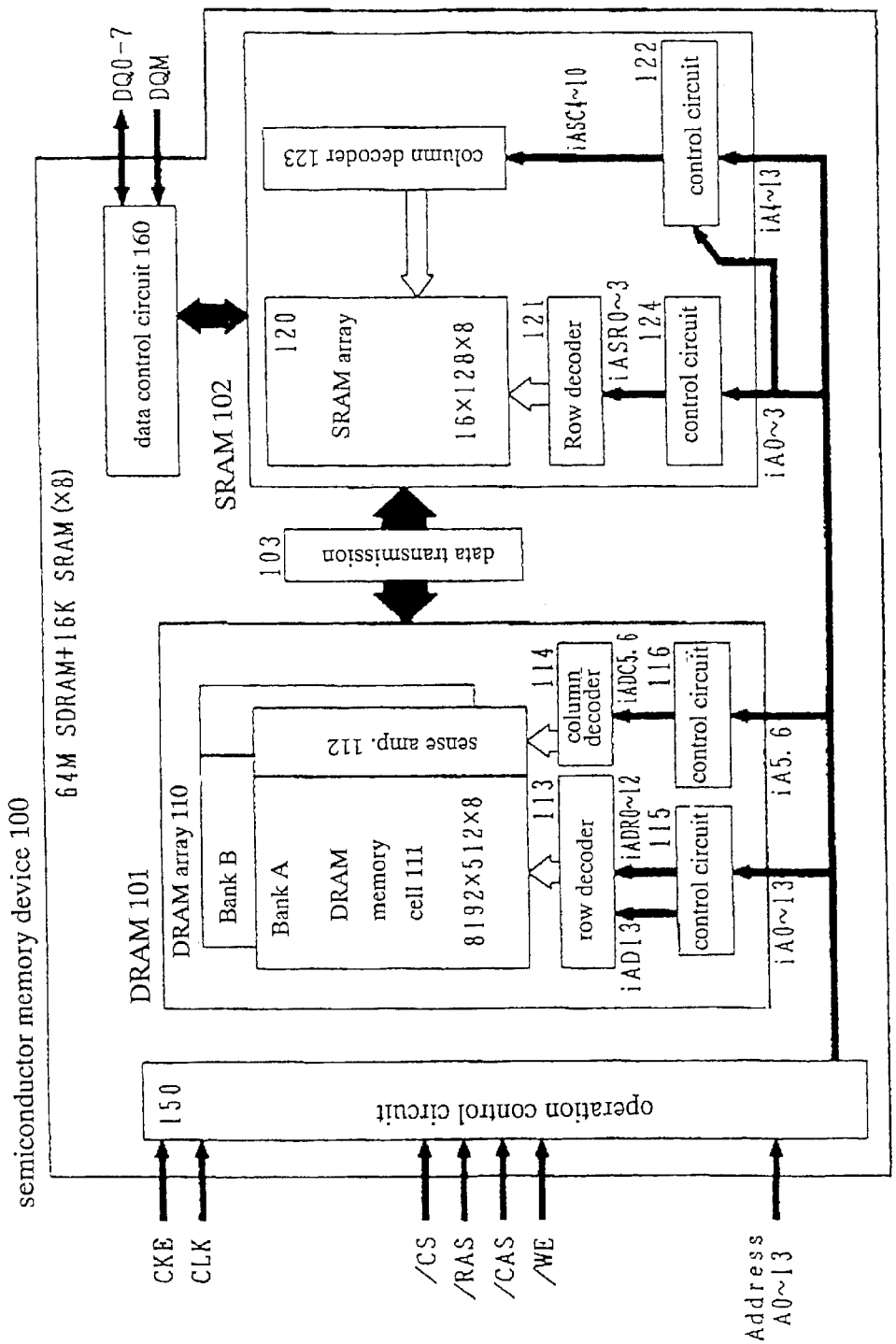
FIG. 1 is a block diagram illustrative of a structure of a novel semiconductor memory device in a first embodiment in accordance with the present invention.

The first aspect of the present invention provides a semiconductor memory device having a dynamic random access memory and a static random access memory for transmissions of data between the dynamic random access memory and the static random access memory, wherein there are provided a plurality of dynamic random access memory arrays, each of which comprises a pair of a dynamic random access memory cell array and a sense amplifier for data read/write operation to the dynamic random access memory cell array, and there is provided at least a static random access memory array, and the plurality of dynamic random access memory arrays and the at least a static random access memory array are connected through at least a data transmission bus.

It is preferable that a data transmission selecting circuit is provided between the dynamic random access memory cell array and the data transmission bus for selecting a connection between the dynamic random access memory cell array and the data transmission bus.

It is also preferable that the static random access memory is connected with at least bit lines for reading data out from the static random access memory cells and a data transmission line for transmission of data in the static random access memory cells to the dynamic random access memory, and the data transmission line is further connected to the data transmission bus.

It is further preferable that the bit lines and the data transmission line are selectively connected to the static random access memory cells.

The second aspect of the present invention provides a data transmission method for a semiconductor memory device having a first type random access memory and a second type random access memory for transmissions of data between the first type random access memory and the second type random access memory through a data transmission bus, wherein charges in the first type random access memory are transmitted onto the data transmission bus before those charges as charged in the data transmission bus onto bit lines of the second type random access memory in order to transmit data from the first type random access memory to the second type random access memory.

It is preferable that a data transmission is made by connecting data transmission lines to the data transmission bus and concurrently data are read out from second type random access memory cells through bit lines, where the second type random access memory cells are connected with at least bit lines and the data transmission lines.

It is also preferable that charges in the first type random access memory are transmitted onto the data transmission bus before a disconnection is then made between the first type random access memory and the data transmission bus.

It is further preferable that n charges on the data transmission bus are transmitted to the second type random access memory before a disconnection is then made between the second type random access memory and the data transmission bus.

It is also preferable that the first type random access memory is a static random access memory.

PREFERRED EMBODIMENT

A first embodiment according to the present invention will be described in detail with reference to the drawings. FIG. 1 is a block diagram illustrative of a structure of a novel semiconductor memory device in a first embodiment in accordance with the present invention. The first novel semiconductor memory device has a dynamic random access memory 101 and a static random access memory 102, The dynamic random access memory 101 has a plurality of DRAM memory arrays 110. Each of the DRAM memory arrays 110 has a pair of a memory cell array 111 and a sense amplifier 112 for data read write operation to the memory cell array 111. The static random access memory 102 has at least an SRAM memory array 120. The semiconductor memory device 100 also has a bi-directional data transmission circuit 103 connected between the dynamic random access memory 101 and the static random access memory 102 for accomplishing data transmissions between them. The dynamic random access memory 101 serves as a main memory, whilst the static random access memory 102 serves as a subordinate memory. The semiconductor memory device 100 also has a plurality of data transmission buses connected between the DRAM memory arrays 110 and the SRAM memory array 120 for data transmission between them.

The dynamic random access memory 101 has a plurality of DRAM memory arrays 110 having dynamic memory cell arrays aligned in matrix. The dynamic random access memory 101 also has a DRAM row control circuit 115 for generating DRAM row selecting signals iADR0, iADR1, iADR2, iADR3 and a bank selecting signal on the basis of internal address signals iA0, - - - , iA13. The dynamic random access memory 101 also has a DRAM row decoder 113 connected to the DRAM row control circuit 115 for receiving the DRAM row selecting signal and the bank selecting signal from the DRAM row control circuit 115 in order to select a corresponding row of the DRAM memory array 110 on the basis of the received DRAM row selecting signal and the bank selecting signal. The dynamic random access memory 101 also has DRAM column control circuit 116 for generating DRAM column selecting signals iADC0, iADC1, iADC2, iADC3 on the basis of internal address signals iA5 and iA6. The dynamic random access memory 101 also has a DRAM column decoder 114 connected to the DRAM column control circuit 116 for receiving the DRAM column selecting signal from the DRAM column control circuit 116 in order to select a corresponding column of the DRAM memory array 110 on the basis of the received DRAM column selecting signal. The dynamic random access memory 101 also has a DRAM memory cell array 111 and a sense amplifier 112 for sensing and amplifying data stored in the selected cell in the DRAM memory cell array 111. The DRAM memory array 110 is structurally divided into two banks A and B, one of which is selected in accordance with a bank selecting signal iAD13

The static random access memory 102 has a single SRAM memory array 120 having static memory cell arrays aligned in matrix. The static random access memory 102 also has an SRAM row control circuit 124 for generating SRAM row selecting signals iASR0, iASR1, iASR2, iASR3 on the basis of internal address signals iA0, - - - , iA3. The static random access memory 102 also has an SRAM row decoder 121 connected to the SRAM row control circuit 124 for receiving the SRAM row selecting signal from the SRAM row control circuit 124 in order to select a corresponding row of the SRAM memory array 120 on the basis of the received SRAM row selecting signal. The static random access memory 102 also has an SRAM column control circuit 122 for generating SRAM column selecting signals iASC0, iASC1 iASC2, iASCA3 on the basis of internal address signals iA4, - - - , iA13. The static random access memory 102 also has a SRAM column decoder 123 connected to the SRAM column control circuit 122 for receiving the SRAM column selecting signals from the SRAM column control circuit 122 in order to select a corresponding column of the SRAM memory array 120 on the basis of the received SRAM column selecting signal.

The semiconductor memory device 101 further has an operation control circuit 150 for controlling operations of the semiconductor memory device 100. The semiconductor memory device 101 further has a data control circuit 160 for controlling the data transmissions to the external device.

Figure 2:
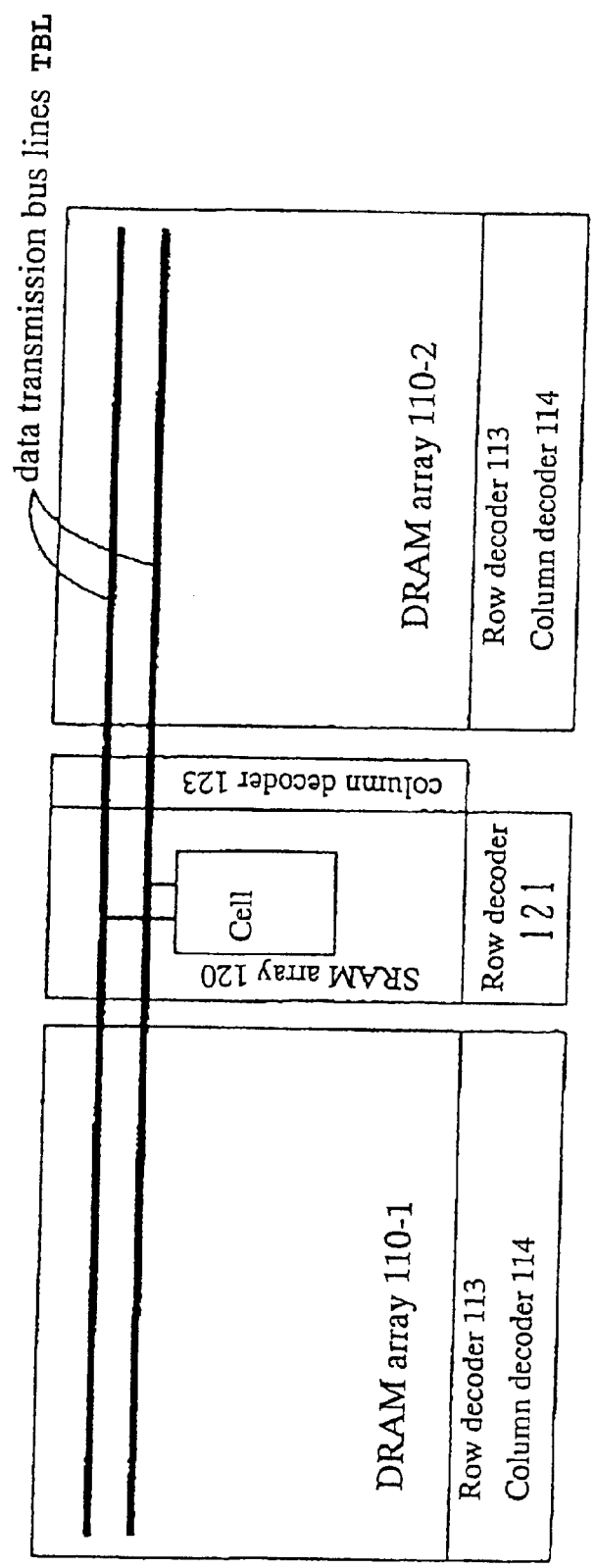
FIG. 2 is a block diagram illustrative of an array structure of the novel semiconductor memory device of FIG. 1.

FIG. 2 is a block diagram illustrative of an array structure of the novel semiconductor memory device of FIG. 1. Whereas in this embodiment, the dynamic random access memory serves as the main memory, whilst the static random access memory serves as the sub-ordinate memory. The DRAM memory array 110 is structurally divided into a first DRAM memory array 110-1 and a second DRAM memory array 110-2. The SRAM memory array 120 and the SRAM column decoder 123 are provided between the first DRAM memory array 110-1 and the second DRAM memory array 110-2, and further the DRAM row decoder 113 and the DRAM column decoder 114 are provided adjacent to each of the first DRAM memory array 110-1 and the second DRAM memory array 110-2. This above array structure allows data transmissions between cell groups on any selected row of the DRAM selected by the DRAM row decoder 113 and cell groups on any selected row of the SRAM selected by the SRAM row decoder 121 adjacent to the SRAM array 120, thereby allowing a direct mapping method and a set associative mapping method.

The data transmission buses TBL are provided which extend over the first DRAM array 110-1, the second DRAM array 110-2, the SRAM array 120 and the SRAM column decoder 123. The first DRAM array 110-1 corresponds to the bank A, and the second DRAM array 110-2 corresponds to the bank B.

Figure 3:
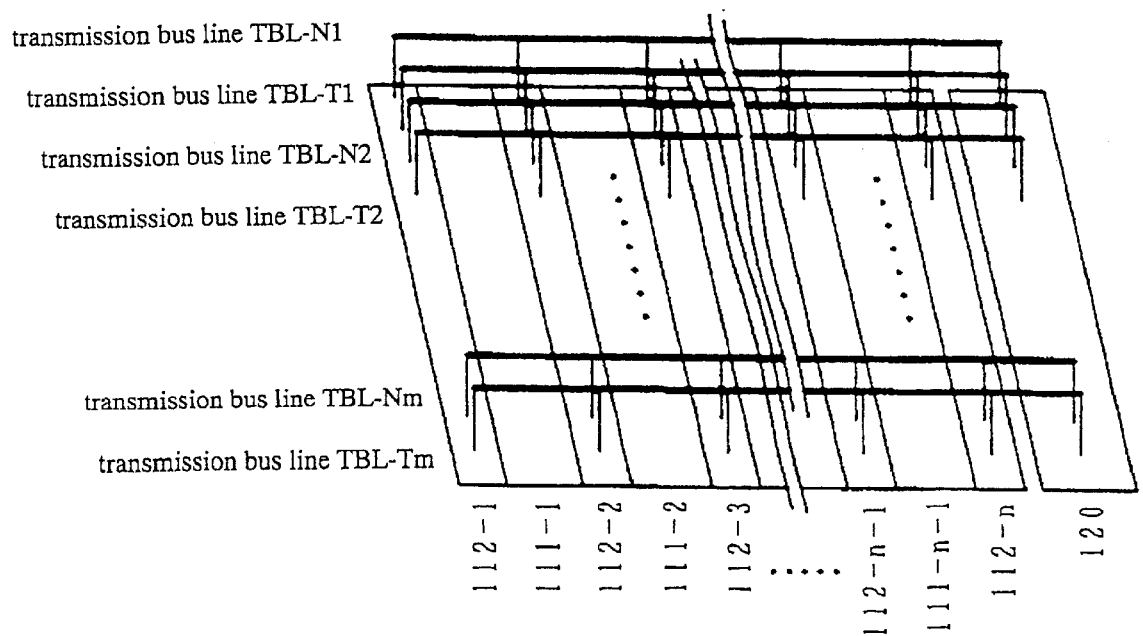
FIG. 3 is a diagram illustrative of layout of the data transmission buses TBL in the semiconductor memory device of FIG. 1.

FIG. 3 is a diagram illustrative of layout of the data transmission buses TBL in the semiconductor memory device of FIG. 1. A plural pairs of the data transmission buses TBL extend in parallel to each other, wherein each of the data transmission buses TBL is provided which extends to connect the sense amplifiers of the plural rows of the DRAM array to the SRAM array.

Figure 4:
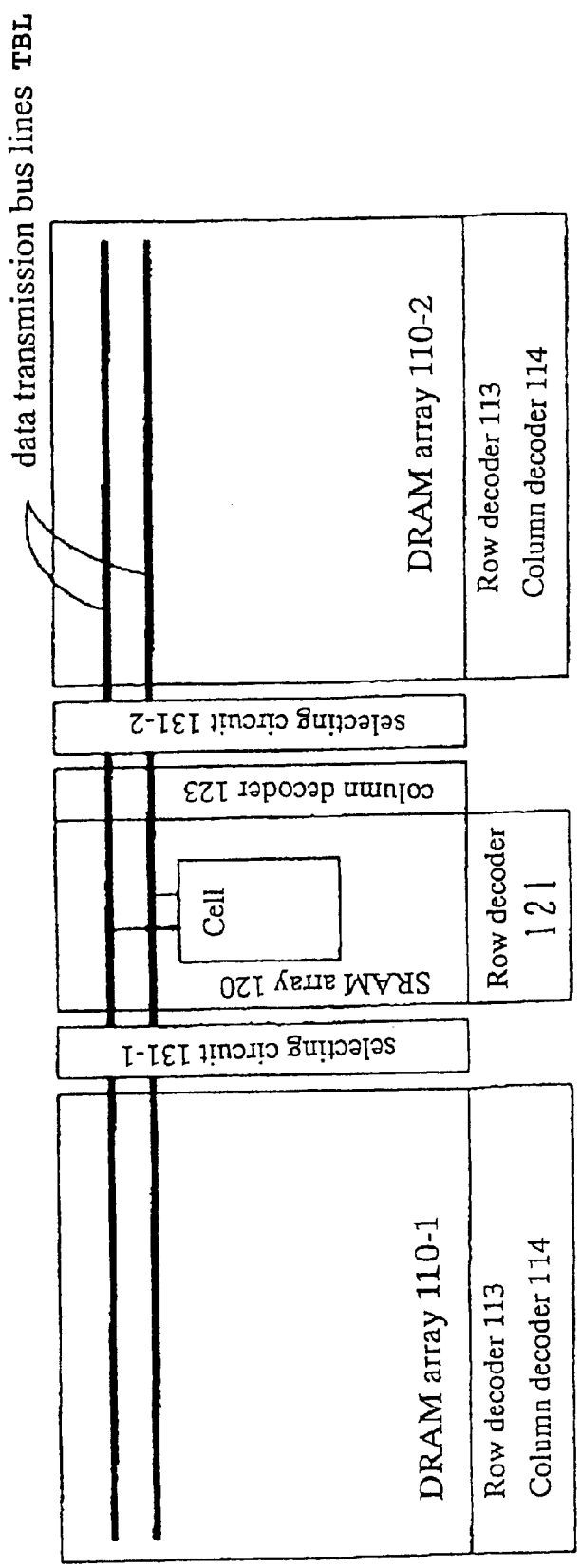
FIG. 4 is a block diagram illustrative of another array structure of the novel semiconductor memory device of FIG. 1.

FIG. 4 is a block diagram illustrative of another array structure of the novel semiconductor memory device of FIG. 1. The DRAM memory array 110 is structurally divided into a first DRAM memory array 110-1 and a second DRAM memory array 110-2. The SRAM memory array 120 and the SRAM column decoder 123 are provided between the first DRAM memory array 110-1 and the second DRAM memory array 110-2, and further the DRAM row decoder 113 and the DRAM column decoder 114 are provided adjacent to each of the first DRAM memory array 110-1 and the second DRAM memory array 110-2. Further, a first transmission selecting circuit 131-1 is provided between the first DRAM memory array 110-1 and the SRAM memory array 120. A second transmission selecting circuit 131-2 is provided between the second DRAM memory array 110-2 and the SRAM memory array 120. Provisions of the first and second transmission selecting circuits 131-1 and 131-2 allows that the data transmission buses on the inoperable DRAM array in accordance with the DRAM array selecting signal, so that a possible reduction in discharge current for data transmission and an improvement in high speed data transmission are obtainable. This above array structure allows data transmissions between cell groups on any selected row of the DRAM selected by the DRAM row decoder 113 and cell groups on any selected row of the SRAM selected by the SRAM row decoder 121 adjacent to the SRAM array 120, thereby allowing a direct mapping method and a set associative mapping method. The first DRAM array 110-1 corresponds to the bank A, and the second DRAM array 110-2 corresponds to the bank B.

As a modification to the above, it is possible to further divide the DRAM array and further provide additional selecting circuits for selectively connecting the data transmission buses.

Figure 5:
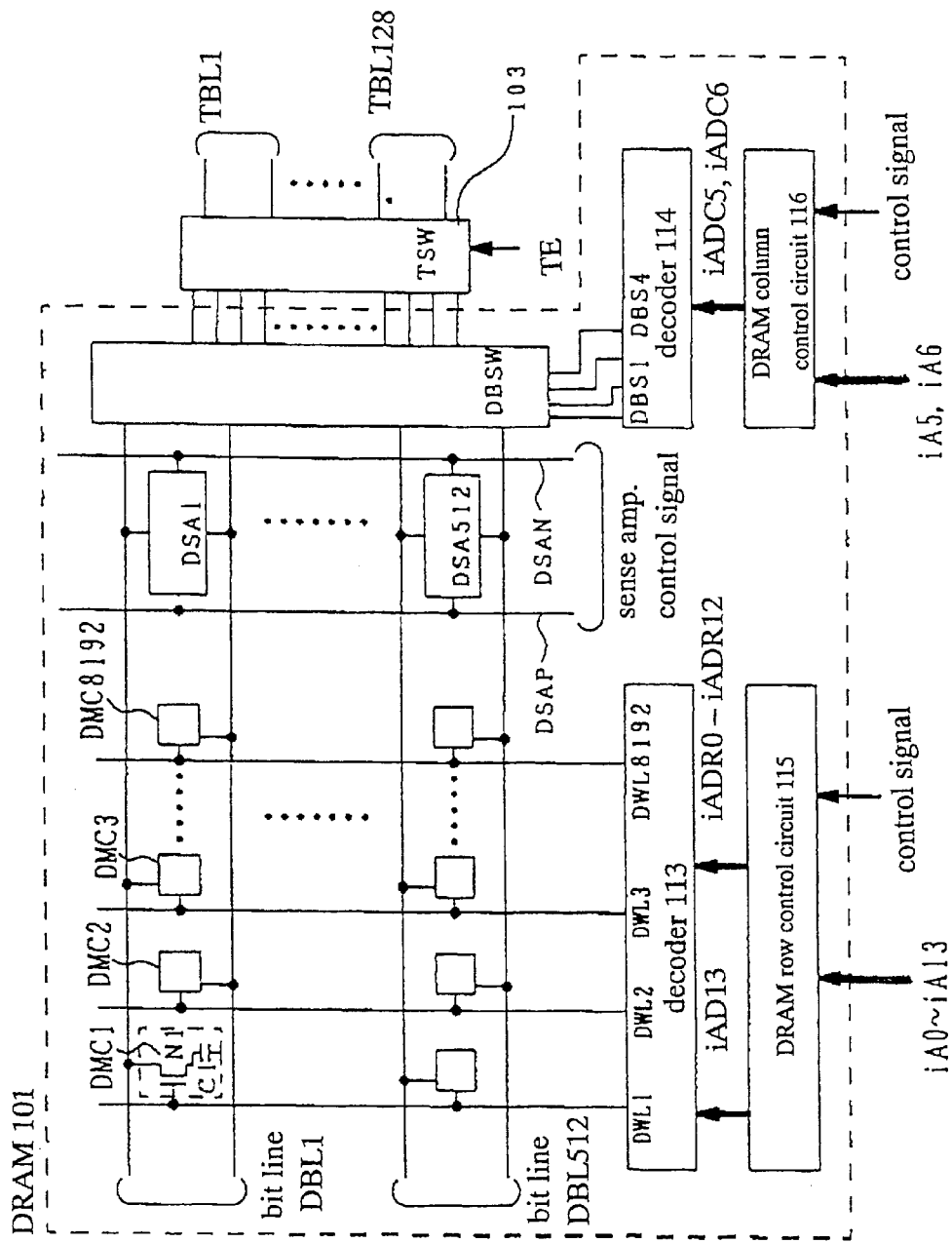
FIG. 5 is a diagram illustrative of a circuit configuration of the dynamic random access memory 101 and the data transmission circuit 103 in the semiconductor memory device of FIG. 1.

FIG. 5 is a diagram illustrative of a circuit configuration of the dynamic random access memory 101 and the data transmission circuit 103 in the semiconductor memory device of FIG. 1. The dynamic random access memory 101 has a plurality of dynamic memory cells DMC aligned in matrix. Each of the dynamic memory cells DMC comprises a pair of a single memory transistor N1 and a memory capacitor C1, An opposite electrode of the memory capacitor C1 is applied with a constant or fixed voltage Vgg which may be set to be a half of a power voltage Vcc. The dynamic random access memory 101 also has a plurality of DRAM word lines DWL extending in a column direction and in parallel to each other so that each of the DRAM word lines DWL is connected with gates of the memory transistors aligned on the corresponding column. The dynamic random access memory 101 also has a plurality of DRAM bit lines DBL extending in a row direction and in parallel to each other so that each of the DRAM bit lines DBL is connected through the memory transistors to the memory capacitors aligned on the corresponding column. Adjacent two of the DRAM bit liens DBL make a complementary pair. The dynamic random access memory 101 also has a plurality of sense amplifiers DSA in correspondence with the DRAM bit lines DBL.

The sense amplifier DSA has a function of sensing and amplifying a potential difference between the complementary-paired DRAM bit lines DBL. Operations of the sense amplifier DSA are controlled by sense amplifier control signals DSAP and DSAN. In this embodiment, the DRAM array is responsible to 64M-bits with two bank and 8-bits unit, wherein there are provided 8192 of the DRAM word lines DWL1, - - -, DWL8192 and 512 of DRAM bit lines DBL1, - - -, DBL512 and 512 of the sense amplifiers DSA1, - - -, DSA512. This configuration is for one bit of one bank.

The dynamic random access memory 101 has the DRAM row decoder 113 for selecting the DRAM word lines DWL1, - - -, DWL8192 on the basis of the bank selecting signal iAD13 and the DRAM internal row address signals ADR0, - - - iADR12. The dynamic random access memory 101 also has the DRAM row control circuit 115 for generating the DRAM internal row address signals ADR0, - - - iADR12 and the bank selecting signal iAD13 on the basis of the internal address signals iA0, - - - , iA13.

The dynamic random access memory 101 also has a DRAM bit line selecting circuit DBSW for selecting one of four complementary pairs of the DRAM bit lines on the basis of DRAM bit line selecting signals DBS1, - - -, DBS4 generated by the DRAM row decoder 114, so as to connect the selected pair of the DRAM bit lines through the data transmission circuit 103 to the data transmission bus lines TBL. The dynamic random access memory 101 also has a DRAM column control circuit 116 for generating DRAM column address signals iADC5 and iADC6 to be used in the DRAM column decoder 114.

Figure 6:
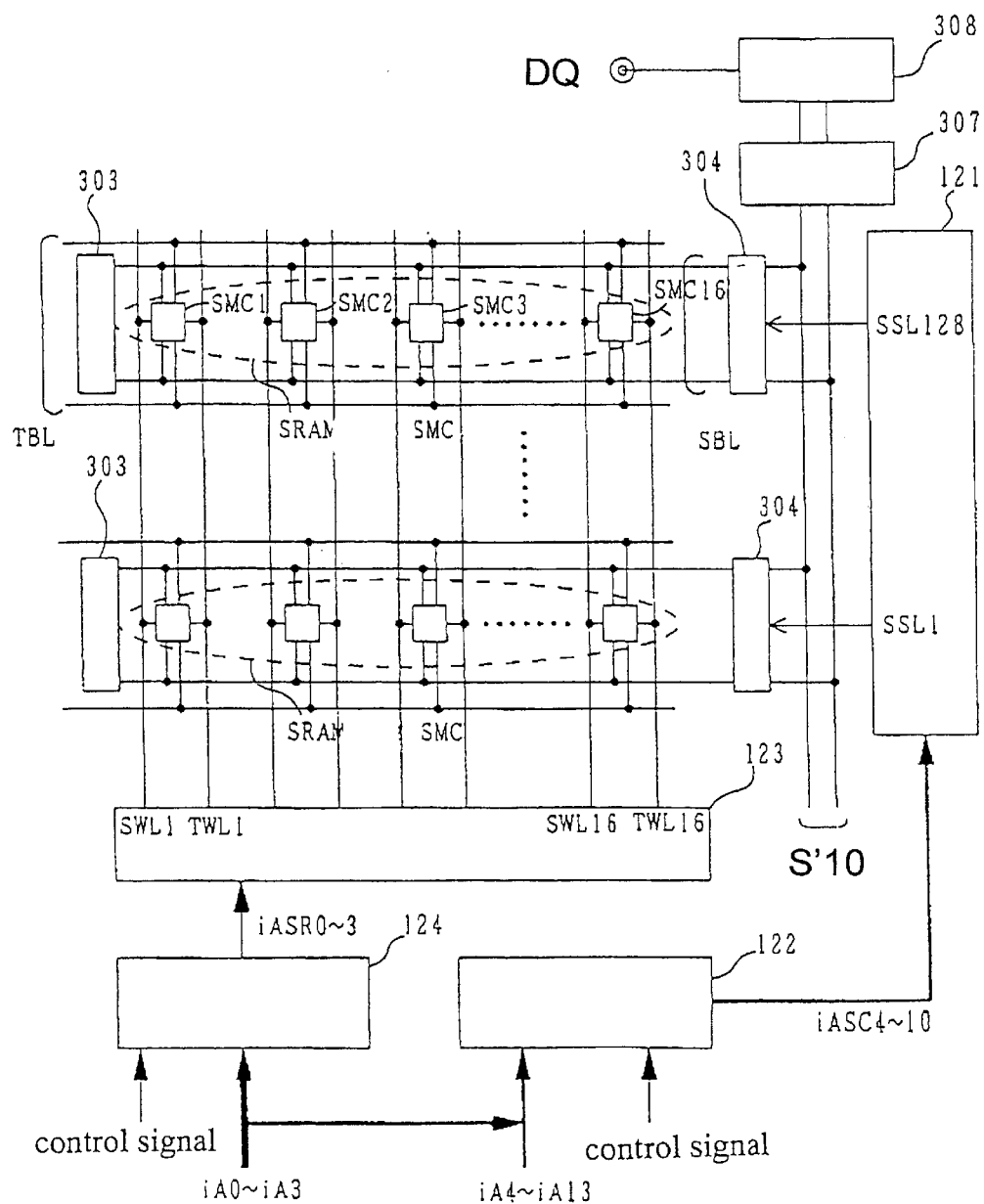
FIG. 6 is a diagram illustrative of a circuit configuration of the static random access memory, the data transmission circuit, and data input/output terminals in the semiconductor memory device of FIG. 1.

FIG. 6 is a diagram illustrative of a circuit configuration of the static random access memory, the data transmission circuit, and data input/output terminals in the semiconductor memory device of FIG. 1. The circuit configuration shown in FIG. 6 is only for one bit of an external data input/output terminal. In this example, the static random access memory is designed for 16 bits with 8-bits unit. It is not intended to limit the circuit configuration into the above configuration.

Figure 7:
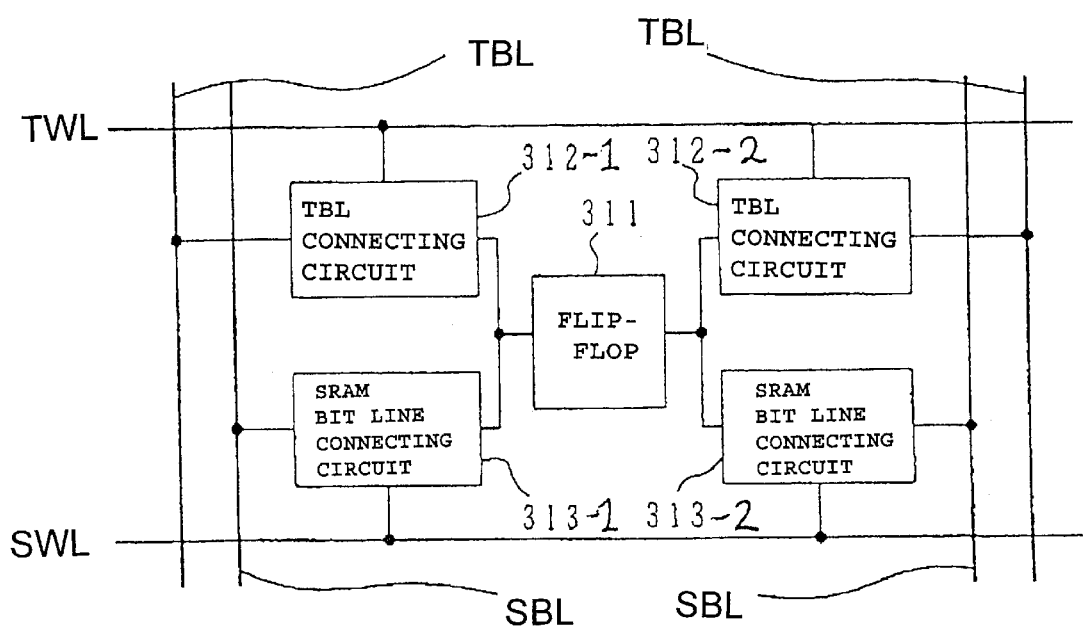
FIG. 7 is a block diagram illustrative of an SRAM memory cell of the static random access memory of FIG. 6.

FIG. 7 is a block diagram illustrative of an SRAM memory cell of the static random access memory of FIG. 6. A flip-flop circuit 311 is provided for storing data in static. A first data transmission bus connecting circuit 312-1 and a first SRAM bit line connecting circuit 313-1 are provided which are connected to one side of the flip-flop circuit 311. A second data transmission bus connecting circuit 312-2 and a second SRAM bit line connecting circuit 313-2 are provided which are connected to an opposite side of the flip-flop circuit 311. Each of the first and second data transmission bus connecting circuits 312-1 and 312-2 is provided for connecting the flip-flip circuit 311 to the data transmission bus line TBL. Each of the first and second SRAM bit line connecting circuits 313-1 and 313-2 is provided for connecting the flip-flip circuit 311 to the SRAM bit line SBL. SRAM cell data transmission row selecting signals TWL1, - - -, TWL16 are transmitted on data transmission row selective signal lines for activating the first and second data transmission bus connecting circuits 312-1 and 312-2 for data transmissions between the DRAM cells and the SRAM cells. SRAM cell read/write row selecting signals SWL1, - - -, SWL16 are transmitted on read/write row selective signal lines for activating the first and second SRAM bit line connecting circuits 313-1 and 313-2 for read/write operations to the SRAM cells. The SRAM decoder 123 is provided for generating the SRAM cell data transmission row selecting signals TWL1, - - - , WL16 and the SRAM cell read/write row selecting signals SWL1, - - -, SWL16. The SRAM row control circuit 124 is also provided for generating the SRAM internal row address signals iASR0, - - -, iASR3 on the basis of the internal address signals iA0, - - -, iA3 and an SRAM control signal, so that the SRAM internal row address signals IASR0, - - -, iASR3 are transmitted to the SRAM TOW decoder 123. It is of course possible that the SRAM cell data transmission row selecting signals TWL1, - - -, TWL16 and the SRAM cell read/write row selecting signals SWL1, - - -, SWL16 are common to each other.

Each pair of the SRAM bit lines SBL has an SRAM bit line control circuit 303 for balancing the bit lines and pre-charging the bit lines, and a SRAM row selecting circuit 304 making data input line SIO and the SRAM bit lines BSL conductive to each other. An SRAM column decoder 121 is provided for generating selecting signals SSL1, - - -, SSL128 which are to be inputted into the SRAM column selecting circuit 304. An SRAM column control circuit 122 is provided for generating SRAM internal address control signals iASC4, - - -, iASC10 to be inputted into the SRAM column decoder 121 on the basis of the internal address signals iA0, - - -, iA13, and the SRAM control signal. The SRAM bit line control circuit 303 may have a sense amplifier circuit for sensing and amplifying voltage level of the SRAM bit lines SBL. Further, the data input/output line SIO is connected to the external data input/output terminal DO through a data input/output circuit 308 and a read/write amplifier 307. This data input/output line may optionally be separated for a read line and a write line.

Read operation or write operation to the SRAM cells are independent from the data transmission operations since the data transmission bus lines TBL and the SRAM bit line SBL are provided.

Figure 8:
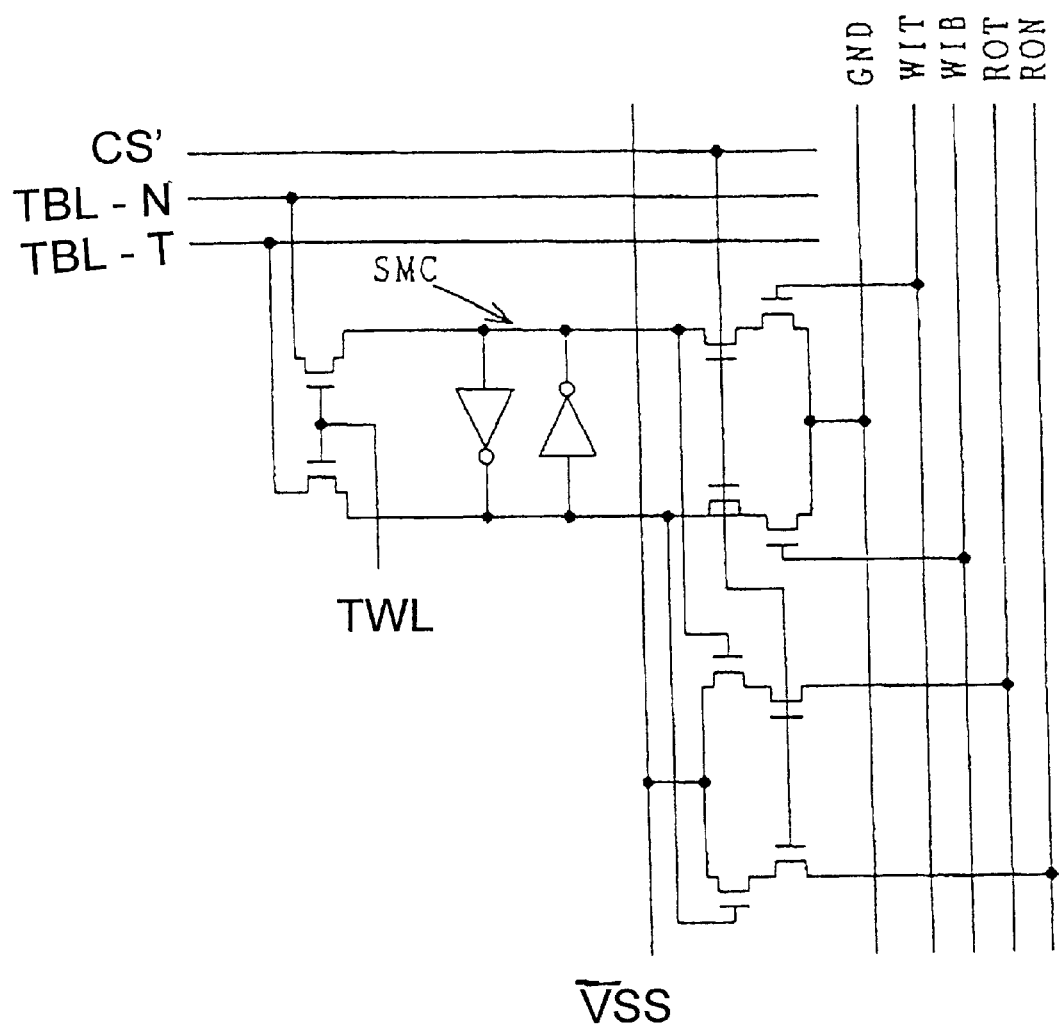
FIG. 8 is a circuit diagram illustrative of an available circuit configuration of an SRAM memory cell in the static random access memory of FIG. 6.
Figure 9:
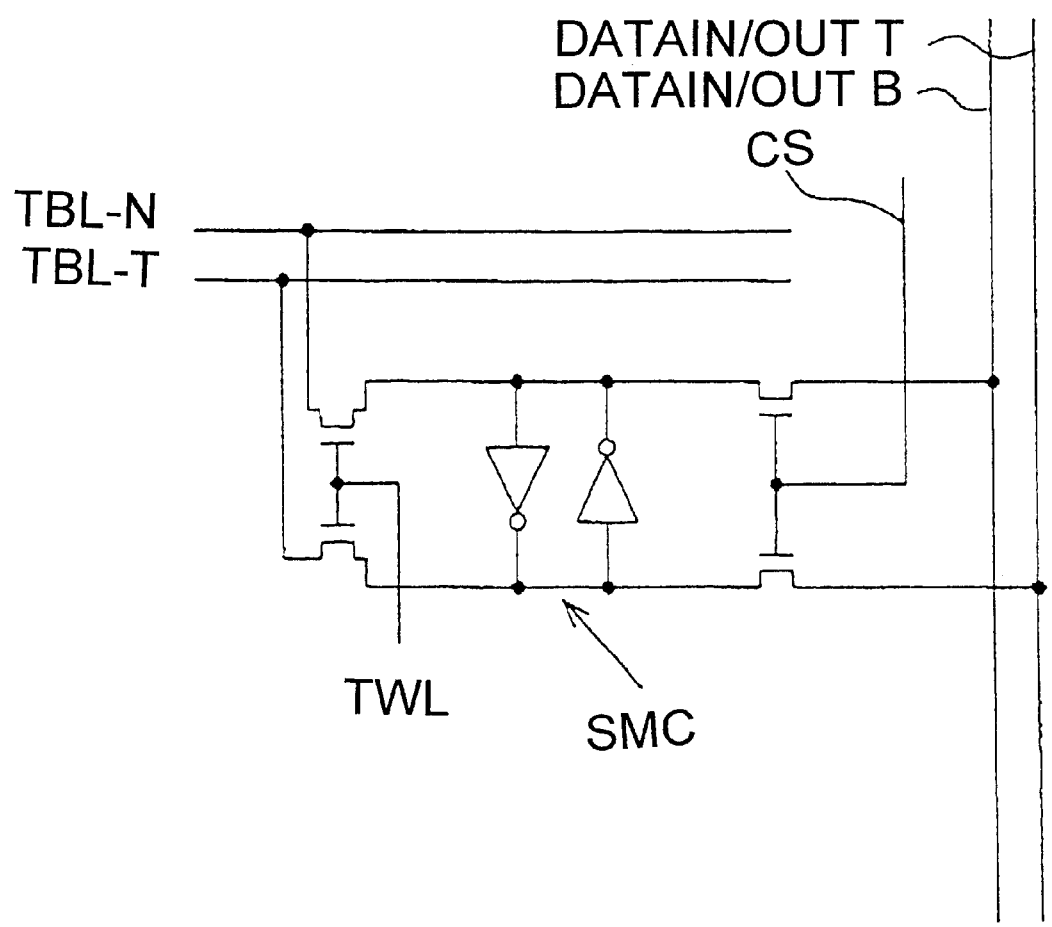
FIG. 9 is a circuit diagram illustrative of another available circuit configuration of an SRAM memory cell in the static random access memory of FIG. 6.

FIG. 8 is a circuit diagram illustrative of an available circuit configuration of an SRAM memory cell in the static random access memory of FIG. 6. FIG. 9 is a circuit diagram illustrative of another available circuit configuration of an SRAM memory cell in the static random access memory of FIG. 6. In order to conduct data transmission from the SRAM array to the DRAM array or re-store transmission, charges in the SRAM cells are transferred onto the data transmission bus line TBL so that data are transmitted from the SRAM cells onto the data transmission bus line TBL. Write operation into the DRAM from the data transmission bus line is also conducted in the same manner. This transmission method allows scaling down the transistor size of the SRAM cell for driving the data transmission bus line.

It is unnecessary for this method to conduct data transmission after data have been amplified by the sense amplifier. It is also unnecessary to conduct the data transmission after a bit line pre-charge has been conducted. This provides no limitation nor restriction to the timings of charging the data transmission lines and to the transmission timing for writing the data sense amplifier.

The SRAM cells are made independent from the above re-store data transmission after a potential difference is given to the paired data transmission bus lines TBL, thereby allowing other operations, for example, read/write operations, resulting in improvement in the high speed performance of the access operation.

It is also possible as shown in FIG. 4 that the provision of the transmission selecting circuit 131 allows the selecting circuit 131 to operate after a potential difference has been given to the data transmission bus lines, so that the SRAM array is made separated from the DRAM array which are on the re-store operation. This allows the SRAM array to commence the data transmission operation to the DRAM array in other bank separately from the above DRAM array being on the data transmission. This means that data transmission operations to the different DRAM arrays may be totally continued, whereby the transmission speed is thus improved. Namely, immediately after the data transmission between one of the DRAM bank and the SRAM, the data transmission between the other bank and the SRAM is made as bank-Ping-Pong operation to improve the effective data transmission speed.

Figure 10:
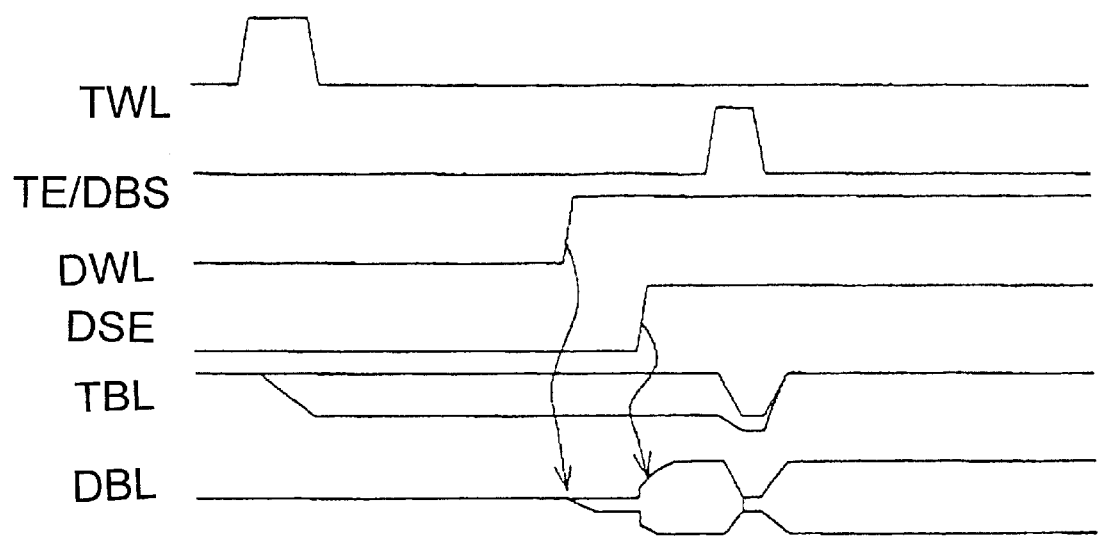
FIG. 10 is a timing chart illustrative of memory device operation for charging data transmission bus lines before a DRAM row is selected in the novel semiconductor memory device of FIG. 1.
Figure 11:
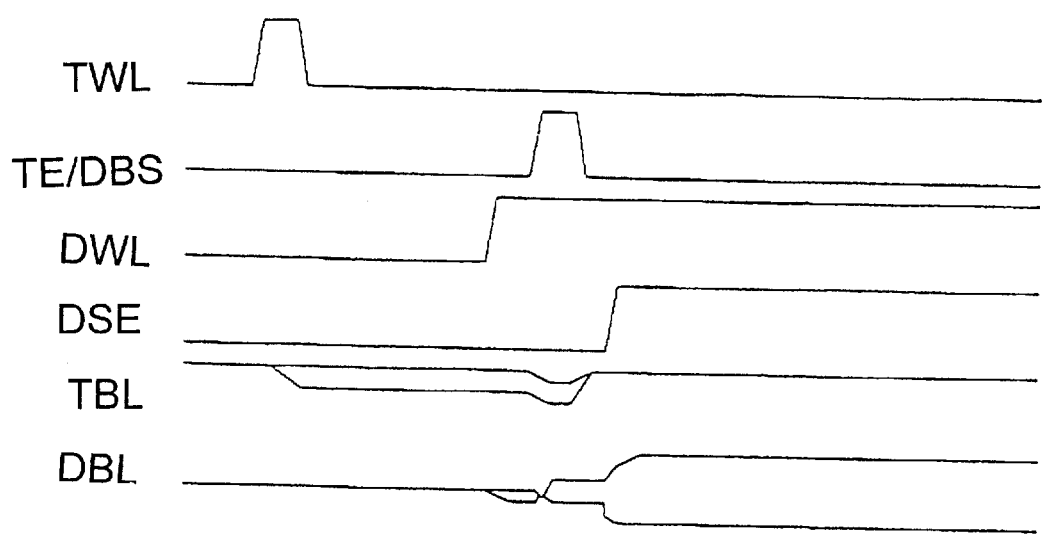
FIG. 11 is a timing chart illustrative of another memory device operation of the novel semiconductor memory device of FIG. 1.
Figure 12:
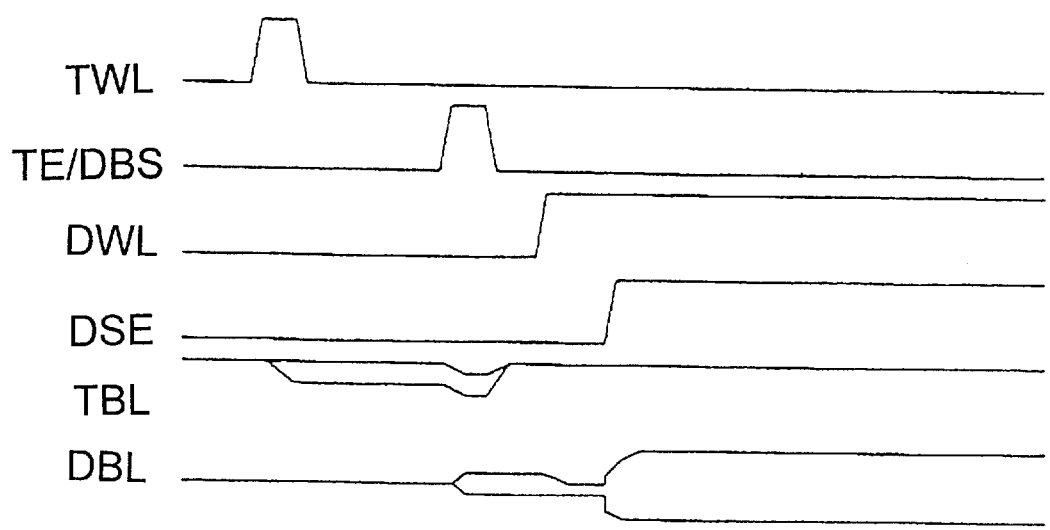
FIG. 12 is a timing chart illustrative of still another memory device operation of the novel semiconductor memory device of FIG. 1.

FIG. 10 is a timing chart illustrative of memory device operation for charging data transmission bus lines before a DRAM row is selected in the novel semiconductor memory device of FIG. 1. In the data transmission from the SRAM to DRAM or the re-store transmission, operation of charging the data transmission bus lines prior to the DRAM row selecting operation will be described with reference to FIG. 10. Prior to the word line selecting operation, the SRAM cell row selecting operation is made to transmit data of the SRAM cells onto the data transmission bus lines, After a certain potential difference has been given to the data transmission bus lines TWL, then a disconnection is made between the SRAM cell and the data transmission bus lines WL, prior to connection to the DRAM bit lines through the data transmission circuit TSW and the DRAM bit selecting circuit DBSW, so that transmission data charged as the potential difference in the data transmission bus lines are written into the DRAM bit lines DBL by capacitive coupling between the capacitance of the data transmission bus lines TBL and the capacitance of the DRAM bit lines DBL. After this write operation has been completed, then a disconnection from the data transmission bus lines is made before the transmission data amplification is made by the sense amplifier and concurrently data writing operation is made to the cells, whereby the re-store transmission operation is thus completed. The timing of connecting the data transmission bus lines TBL to the DRAM it lines DBL or the timing of turning the data transmission activation signal TE ON may be either after the sense amplifier has been activated as shown in FIG. 10 or after the word line has been selected as shown in FIG. 11 or before the word line will be selected as shown in FIG. 12. FIG. 11 is a timing chart illustrative of another memory device operation of the novel semiconductor memory device of FIG. 1. FIG. 12 is a timing chart illustrative of still another memory device operation of the novel semiconductor memory device of FIG. 1.

Figure 13:
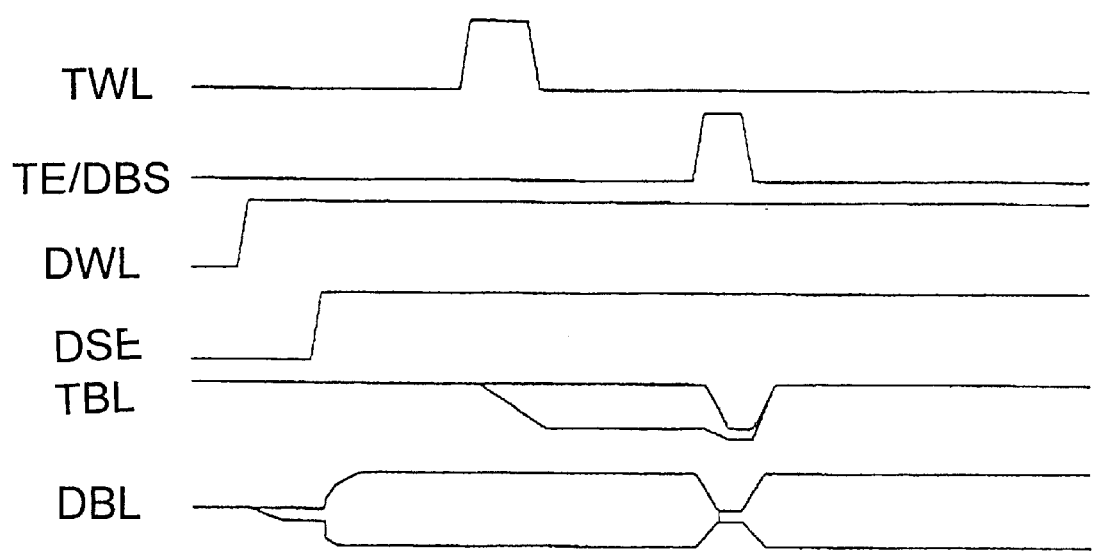
FIG. 13 is a timing chart of a memory cell device operation for charging data transmission bus lines after the DRAM row selection operation has been made of the novel semiconductor memory device of FIG. 1.

FIG. 13 is a timing chart of a memory cell device operation for charging data transmission bus lines after the DRAM row selection operation has been made of the novel semiconductor memory device of FIG. 1. After the DRAM row selecting signal and the sense amplifier activation signal have been activated, the SRAM row selecting operation is made to transmit the SRAM cell data onto the data transmission bus lines TBL. A certain potential difference has been given to the data transmission bus lines, then a disconnection is made between the SRAM cells and the data transmission bus lines prior to connection through the data transmission circuit TSW and the DRAM bit selecting circuit DBSW to the bit line DBL, so that the transmission data charged as the potential difference in the transmission lines are written onto the bit lines DBL. After the write operation has been completed, then a disconnection is made from the data transmission bus line before the amplification of the transmission data is made by the sense amplifier and concurrently writing operation into the cell is also made.

Figure 14:
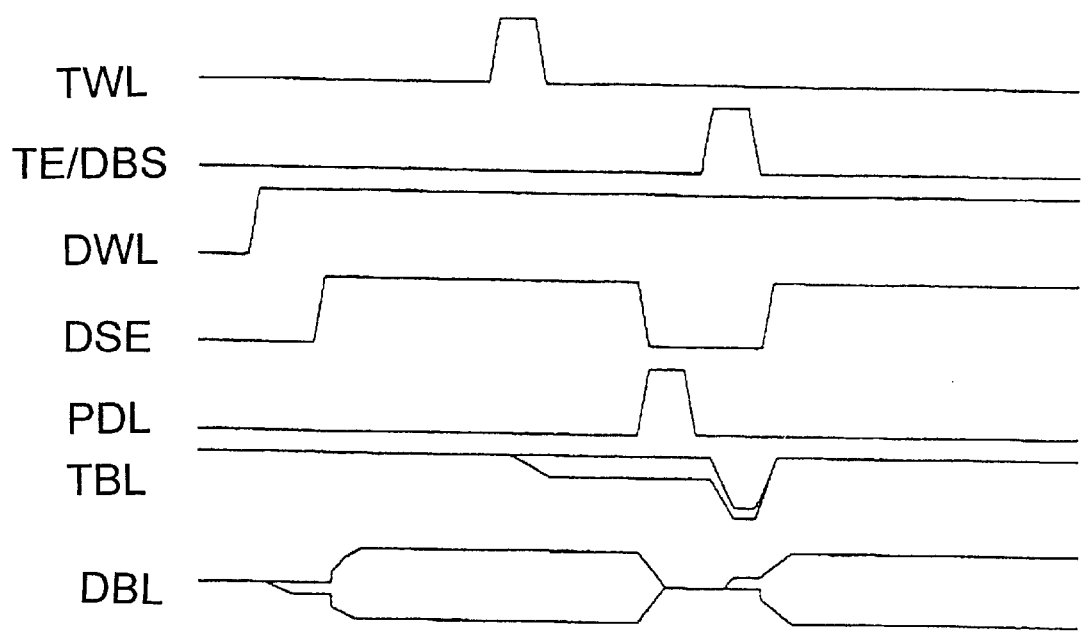
FIG. 14 is a timing chart illustrative of a re-store transmission operation by balancing and pre-charging the bit lines before a connection is made between the data transmission bus lines and the bit lines by the DRAM bit selecting circuit BDSW.
Figure 15:
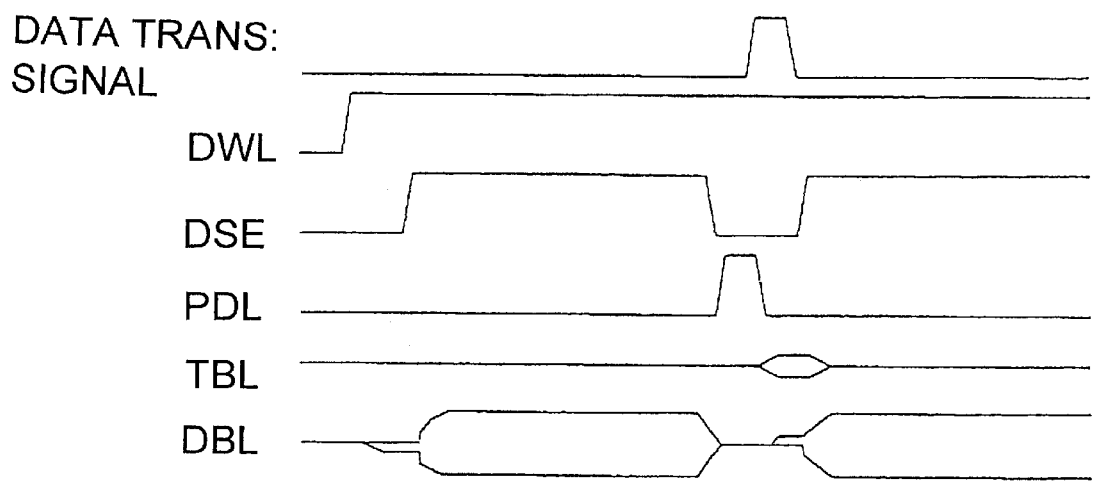
FIGS. 15, 16 and 17 are timing charts of the conventional data transmission operations.
Figure 16:
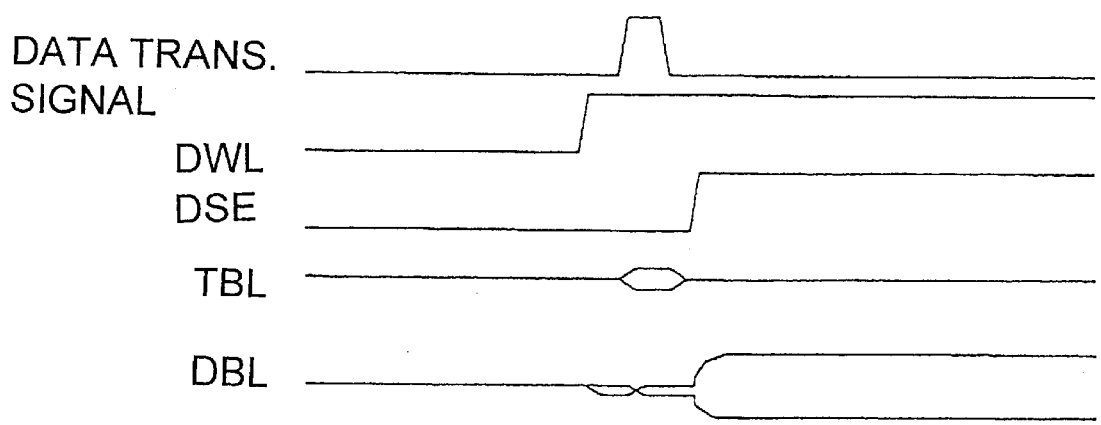
Figure 17:
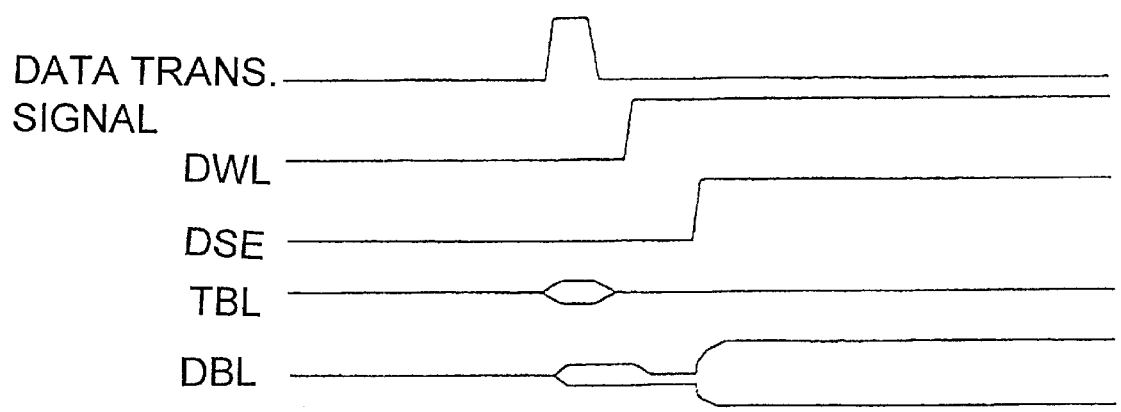

FIG. 14 is a timing chart illustrative of a re-store transmission operation by balancing and pre-charging the bit lines before a connection is made between the data transmission bus lines and the bit lines by the DRAM bit selecting circuit BDSW in order to reduce the necessary potential difference between the data transmission bus lines for a secure data transmission, whereby a driving time for driving the data transmission bus lines by the SRAM cells may be shortened. Further, a discontinuation made for supplying sense amplifier power or ground voltage in data transmission also allows reduction in the necessary potential difference between the data transmission bus lines for the secure data transmission, whereby the necessary time for charging the data transmission bus lines by the SRAM cells may be shortened. In accordance with the above present invention, the transmission data write operation may be made due to the capacitance coupling without balancing/pre-charging the bit lines or discontinuation of supplying the sense amplifier power/ground voltage, whereby the degree of freedom in the timing of the data transmission is increased. FIGS. 15, 16 and 17 are timing charts of the conventional data transmission operations, from which it is understood that the above novel circuit configuration and the novel data transmission method allow high speed transmission of a large number of data in row unit.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor memory device having a dynamic random access memory and a static random access memory for transmissions of data between said dynamic random access memory and said static random access memory, wherein there are provided a plurality of dynamic random access memory arrays, each of which comprises a pair of a dynamic random access memory cell array and a sense amplifier for data read/write operation to said dynamic random access memory cell array, and there is provided at least a static random access memory array, and said plurality of dynamic random access memory arrays and said at least a static random access memory array are connected through at least a data transmission bus.

2. The semiconductor memory device as claimed in claim 1, wherein a data transmission selecting circuit is provided between said dynamic random access memory cell array and said data transmission bus for selecting a connection between said dynamic random access memory cell array and said data transmission bus.

3. A semiconductor memory device having a dynamic random access memory and a static random access memory for transmissions of data between said dynamic random access memory and said static random access memory, wherein there are provided a plurality of dynamic random access memory arrays, each of which comprises a pair of a dynamic random access memory cell array and a sense amplifier for data read/write operation to said dynamic random access memory cell array, and there is Provided at least a static random access memory array, and said plurality of dynamic random access memory arrays and said at least a static random access memory array are connected through at least a data transmission bus, wherein said static random access memory is connected with at least bit lines for reading data out from said static random access memory cells and a data transmission line for transmission of data in said static random access memory cells to said dynamic random access memory, and said data transmission line is further connected to said data transmission bus.

4. The semiconductor memory device as claimed in claim 3, wherein said bit lines and said data transmission line are selectively connected to said static random access memory cells.

5. A data transmission method for a semiconductor memory device having a first type random access memory and a second type random access memory for transmissions of data between said first type random access memory and said second type random access memory through a data transmission bus, wherein changes in said first type random access memory are transmitted onto said data transmission bus before those charges as charged in said data transmission bus onto bit lines of said second type random access memory in order to transmit data from said first type random access memory to said second type random access memory, wherein charges in said first type random access memory are transmitted onto said data transmission bus before a disconnection is then made between said first type random access memory and said data transmission bus.

6. The data transmission method as claimed in claim 5, wherein a data transmission is made by connecting data transmission lines to said data transmission bus and concurrently data are read out from second type random access memory cells through bit lines, where said second type random access memory cells are connected with at least bit lines and said data transmission lines.

7. The data transmission method as claimed in claim 5, wherein charges in said first type random access memory are transmited onto said data transmission bus before a disconnection is then made between said first type random access memory and said data transmissoin bus.

8. The data transmission method as claimed in claim 5, wherein charges on said data transmission bus are transmitted to said second type random access memory before a disconnection is then made between said second type random access memory and said data transmission bus.

9. The data transmission method as claimed in claim 5, wherein said first type random access memory is a static random access memory.

10. The device of claim 1, wherein said static random access memory array is located between two of said dynamic random access memory arrays.

* * * * *